(12) United States Patent
Lee

(10) Patent No.: US 7,807,552 B2
(45) Date of Patent: Oct. 5, 2010

(54) METHOD OF INSPECTING DEFECT OF SEMICONDUCTOR DEVICE

(75) Inventor: Young Bok Lee, Icheon-si (KR)

(73) Assignee: Hynix Semiconductor Inc., Icheon-Si, Kyoungki-do (KR)

( * ) Notice: Subject to any disclaimer, the term of this patent is extended or adjusted under 35 U.S.C. 154(b) by 194 days.

(21) Appl. No.: 12/147,920

(22) Filed: Jun. 27, 2008

(65) Prior Publication Data
US 2009/0029491 A1    Jan. 29, 2009

(30) Foreign Application Priority Data
Jul. 25, 2007    (KR)    ............... 10-2007-0074604

(51) Int. Cl.
*H01L 21/00* (2006.01)
(52) U.S. Cl. ............. 438/462; 438/18; 257/48; 257/E21.522; 257/E21.531
(58) Field of Classification Search ............. 438/18, 438/462; 257/E21.522, E21.523, E21.531, 257/48
See application file for complete search history.

(56) References Cited

U.S. PATENT DOCUMENTS

| 5,480,837 | A | * | 1/1996 | Liaw et al. | 438/626 |
| 6,025,227 | A | * | 2/2000 | Sung | 438/253 |
| 6,251,731 | B1 | * | 6/2001 | Wu | 438/275 |
| 6,958,249 | B1 | * | 10/2005 | Tzeng et al. | 438/18 |
| 2001/0045618 | A1 | * | 11/2001 | Trivedi | 257/537 |
| 2002/0179903 | A1 | * | 12/2002 | Seki | 257/48 |
| 2004/0072398 | A1 | * | 4/2004 | Look et al. | 438/200 |
| 2007/0275555 | A1 | * | 11/2007 | Kim | 438/637 |
| 2008/0171428 | A1 | * | 7/2008 | Kai et al. | 438/587 |

FOREIGN PATENT DOCUMENTS

KR    10-2006-0068216    6/2006

\* cited by examiner

*Primary Examiner*—Caridad M Everhart
(74) *Attorney, Agent, or Firm*—Lowe Hauptman Ham & Berner LLP

(57) ABSTRACT

A method of inspecting defects in a semiconductor device includes forming a test pattern in a scribe lane region of a semiconductor substrate. The test pattern includes a second conductive layer formed on an isolation layer of the semiconductor substrate. Further, the method includes measuring a current flowing between the second conductive layer and the semiconductor substrate by applying a first voltage between the second conductive layer and the semiconductor substrate. Defects formed in the isolation layer can be inspected during a semiconductor manufacturing process. Accordingly, the yield of semiconductor devices can be improved with the inspection results.

6 Claims, 2 Drawing Sheets

METHOD OF INSPECTING DEFECT OF SEMICONDUCTOR DEVICE

CROSS-REFERENCES TO RELATED APPLICATIONS

The present application claims priority to Korean patent application number 10-2007-0074604, filed on Jul. 25, 2007, which is incorporated by reference in its entirety.

BACKGROUND

The present invention relates to a method of inspecting defects in a semiconductor device. More particularly, the present invention relates to a method of inspecting defects in a semiconductor device, which method can be performed electrically during the manufacturing process.

In general, a semiconductor device formed in a silicon wafer includes isolation regions for electrically isolating respective semiconductor devices. As semiconductor devices are highly integrated and have become micro, active research has been made to shrink the size of an individual device and also to reduce the isolation region. This is because the formation of the isolation region is an early process step of the entire manufacturing steps and decides the size of an active region and process margin of subsequent process steps.

Isolation layers are formed in the isolation region using a method, such as shallow trench isolation (STI). According to the STI method, a nitride layer with an etch selectivity different from that of a semiconductor substrate is first formed on the semiconductor substrate. The nitride layer is patterned in order to use the nitride layer as a hard mask, thus forming a nitride layer pattern. The semiconductor substrate is etched to a predetermined depth by an etch process using the nitride layer pattern as a hard mask, thereby forming trenches. The trenches are gap-filled with insulating materials, for example, a high-density plasma (HDP) oxide layer, an $O_3$-TEOS oxide layer, etc. A polishing process, such as chemical mechanical polishing (CMP), is performed on the oxide layer formed over the semiconductor substrate, so that the isolation layers are formed in the trenches.

However, in the technology of 80 nm or less level, the aspect ratio of the trench is increased in line with micro process technologies. Consequently, void is generated due to the limited characteristics of an oxide layer to gap-fill the trench and, therefore, the isolation layer defective. Due to the defective isolation layer, an insulating characteristic of a corresponding semiconductor device is degraded and the corresponding semiconductor device can fail. Accordingly, it becomes important to perform a process for finding defective semiconductor devices by inspecting for the defects.

SUMMARY

In essence, the present invention contemplates a method of inspecting defects in a semiconductor device. The method, can inspect a defect occurring in an isolation layer during a semiconductor manufacturing process by measuring a current flowing between a conductive layer and a semiconductor substrate of a test pattern formed up to the conductive layer corresponding to a control gate of the semiconductor device.

A method for inspecting defects in a semiconductor device according to an aspect of the present invention includes forming a test pattern, which is formed in a scribe lane region of a semiconductor substrate and includes a second conductive layer formed on an isolation layer of the semiconductor substrate, and measuring a current flowing between the second conductive layer and the semiconductor substrate by applying a first voltage between the second conductive layer and the semiconductor substrate.

The size of the test pattern may be 1 to 5% of a size of a semiconductor device region formed in a die region of the semiconductor substrate corresponding to the test pattern. The first voltage may range from 10 to 30V. When the amount of the current flowing between the second conductive layer and the semiconductor substrate in the test pattern is 1.0E-6 to 1.0E-2 Ampere, it may be determined that there is a defect in a semiconductor device corresponding to the test pattern. The formation of the test pattern includes forming a gate insulating layer and a first conductive layer over the semiconductor substrate, etching the first conductive layer, the gate insulating layer, and the semiconductor substrate and gap-filling the etch result with an insulating material to thereby form an isolation layer, and forming the second conductive layer over the first conductive layer including the isolation layer. The second conductive layer of the test pattern may not be patterned, but the second conductive layer of the die region should be patterned. A capacitor may be further formed in the gate insulating layer after the second conductive layer is formed.

DESCRIPTION OF SPECIFIC EMBODIMENT

Now, an embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the scope of the present invention.

Figure 1:
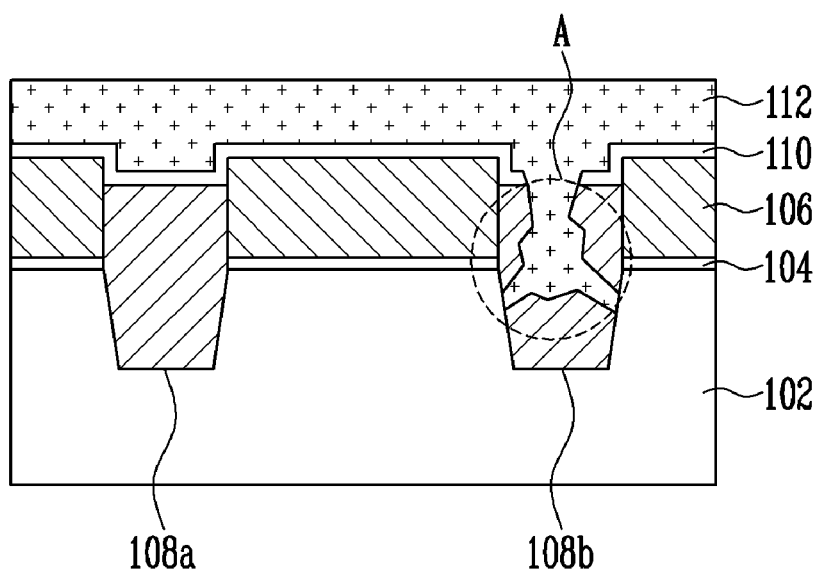
FIG. 1 is a cross-sectional view of a test pattern formed in a scribe lane region of a semiconductor substrate, for describing a method of inspecting defects in a semiconductor device in accordance with an embodiment of the present invention.

FIG. 1 is a cross-sectional view of a test pattern formed in a scribe lane region of a semiconductor substrate, for describing a method of inspecting defects of a semiconductor device in accordance with an embodiment of the present invention.

Typically, semiconductor device manufacturing processes are performed at the same time in a die region and a scribe lane region of a semiconductor substrate 102. That is, a test pattern 100 formed in the scribe lane region of the semiconductor substrate 102 is formed using the same process step as that of a semiconductor device formed in the die region of the semiconductor substrate 102. Thus, it should be noted that, defects occurring in the test pattern 100 can also occur in the semiconductor device formed in the die region corresponding to the scribe lane region in which the test pattern 100 is formed. If it is sought to inspect the defects occurring in the test pattern 100, defects in the die region corresponding to the scribe lane region can also be inspected.

However, the scribe lane region has a very small width compared to that of the die region. If the size of the test pattern 100 is excessively small, correlation between the defects occurring in the test pattern 100 formed in the scribe lane region and the defects occurring in the semiconductor device formed in the die region corresponding to the scribe lane region may be low. Accordingly, it is preferred that the size of the test pattern 100 formed in the scribe lane region is 1 to 5% of the size of the semiconductor device formed in the die region corresponding to the scribe lane region.

Referring to FIG. 1, in order to form the test pattern 100 in accordance with the present invention, a gate insulating layer 104 and a first conductive layer 106 are first formed over the semiconductor substrate 102 including a die region (not shown) and a scribe lane region. The gate insulating layer 104 corresponds to a tunnel insulating layer of a semiconductor device (not shown) formed in the die region (not shown). The first conductive layer 106 corresponds to a floating gate for trapping charges in the semiconductor device (not shown) formed in the die region (not shown). Next, the gate insulating layer 104 and the first conductive layer 106 formed in the isolation region of the die region (not shown) of the semiconductor substrate 102 are patterned, and trenches are formed in the semiconductor substrate 102. Here, in the scribe lane region of the semiconductor substrate 102, the gate insulating layer 104 and the first conductive layer 106 are patterned with the same width and size as those of the trench, thus forming trenches in the scribe lane region. Thereafter, an insulating material such as an oxide layer is formed on the first conductive layer 106, including the trenches, so that the trenches are gap-filled with the insulating material.

However, as the line width of the semiconductor manufacturing process is gradually miniaturized, the size of the trench gradually decreases. Thus, when the trench is being gap-filed with the insulating material, a defect A such as a void may occur. If this defect A is generated in the scribe lane region, a defect may be expected in a trench of the die region (not shown) on which the same process is performed. A polishing process, such as CMP, is performed on the insulating material on the first conductive layer 106, thus forming isolation layers 108a and 108b in the semiconductor substrate 102. The active region of the semiconductor substrate 102 is defined by the isolation layers 108a and 108b.

In order to decrease the height of the isolation layers 108a and 108b, an etch process is performed on a surface of the isolation layers 108a and 108b. Thus, the effective field height (EFH) of the isolation layer is controlled to increase the contact area of the dielectric layer and the floating gate. Here, the defect A occurred in the isolation layer 108b is further expanded, so that the underlying semiconductor substrate 102 may be exposed.

A dielectric layer 110 is formed on the first conductive layer 106 including the isolation layers 108a and 108b. The dielectric layer 110 may not be formed on the isolation layer 108b having the defect A because of the defect A. A second conductive layer 112 is formed on the dielectric layer 110. The second conductive layer 112 corresponds to a control gate of the semiconductor device (not shown) formed in the die region (not shown). Here, the second conductive layer 112 and the semiconductor substrate 102 can be electrically connected through the defect A formed in the isolation layer 108b, so that device fail may occur. Meanwhile, after the second conductive layer 112 is formed, a gate is formed, in the semiconductor device (not shown), in the die region (not shown) by performing a patterning process on the second conductive layer 112. However, in the test pattern 100 formed in the scribe lane region, a patterning process is not performed on the second conductive layer 112.

In order to check the characteristics of the tunnel insulating layer formed in the die region (not shown), a capacitor is formed in the gate insulating layer 110 of the test pattern 100 and the characteristics of the gate insulating layer 110 are checked.

Next, in order to determine whether the defect A has occurred in the isolation layers 108a and 108b, defect inspection according to the present invention is performed on the test pattern 100. To this end, after the test pattern 100 on which defect inspection will be performed is selected, a specific voltage, for example, 10 to 30V is applied to the second conductive layer 112 of the corresponding test pattern 100 and the semiconductor substrate 102 is grounded and applied with 0V. Thereafter, a current flowing between the second conductive layer 112 and the semiconductor substrate 102 is measured at the specific voltage. If the defect A has not occurred in the isolation layer 108a, current rarely flows. However, if a specific current or higher, for example, 1.0E-6 to 1.0E-2 Ampere flows, it is considered that the second conductive layer 112 and the semiconductor substrate 102 are short since the defect A is generated in the isolation layer 108b of the corresponding test pattern 100. Accordingly, it can be identified that the defect has occurred in the corresponding test pattern 100 and the same defect has also occurred in the semiconductor device (not shown) of a corresponding die region (not shown).

Figure 2A:
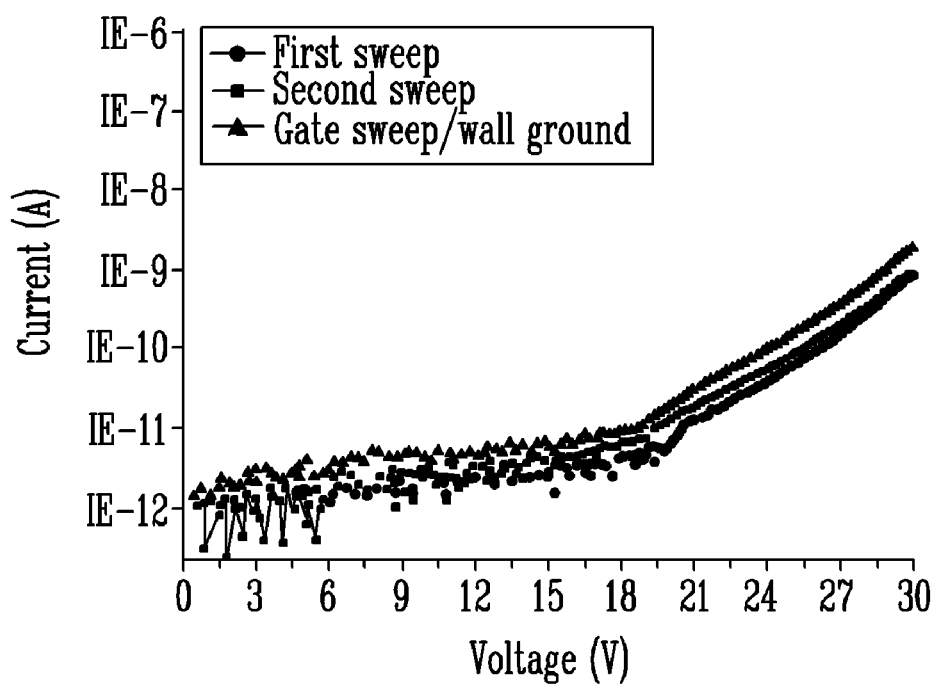
FIG. 2A is a breakdown voltage characteristic graph between a second conductive layer and a semiconductor substrate in a test pattern in which the defects were not generated in an isolation layer.
Figure 2B:
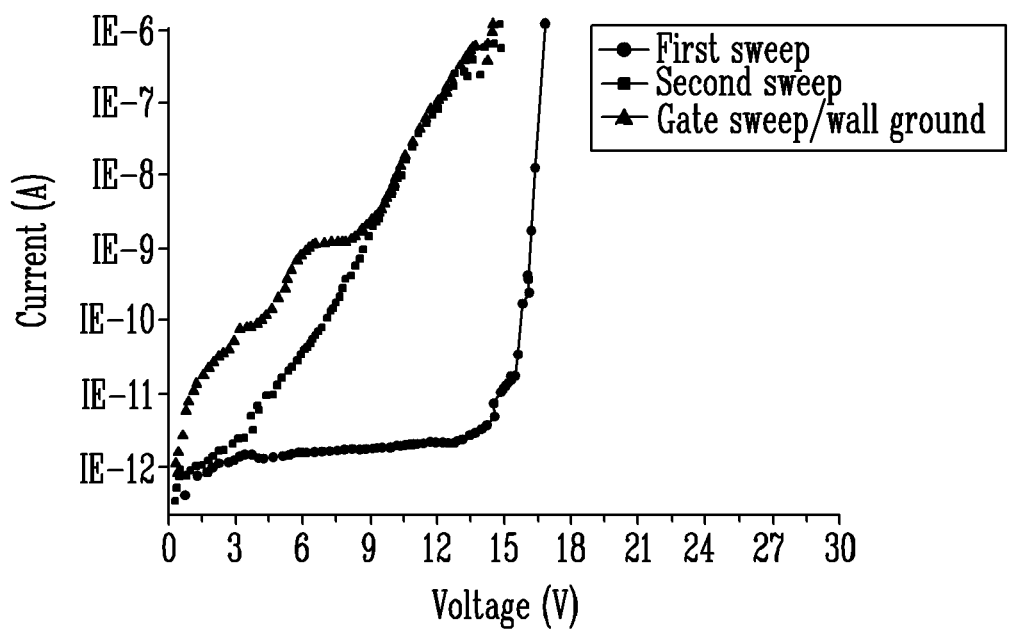
FIG. 2B is a breakdown voltage characteristic graph between a second conductive layer and a semiconductor substrate in a test pattern in which the defects were generated in an isolation layer.

FIG. 2A is a breakdown voltage (BV) characteristic graph between the second conductive layer 112 (refer to FIG. 1) and the semiconductor substrate 102 (refer to FIG. 1) in the test pattern 100 (refer to FIG. 1) in which the defect was not generated in the isolation layer. From FIG. 2A, it can be seen that, although voltage rises in the test pattern where defects were not generated in the isolation layer, current at corresponding voltages is maintained to 1.0E-8 Ampere or less, therefore an excellent insulating characteristic is obtained. FIG. 2B is a breakdown voltage (BV) characteristic graph between the second conductive layer 112 (refer to FIG. 1) and the semiconductor substrate 102 (refer to FIG. 1) in the test pattern 100 (refer to FIG. 1) in which a defect was generated in the isolation layer. From FIG. 2B, it can be seen that current abruptly rises at a specific voltage, about 15V due to the defect occurred in the isolation layer.

Figure 3:
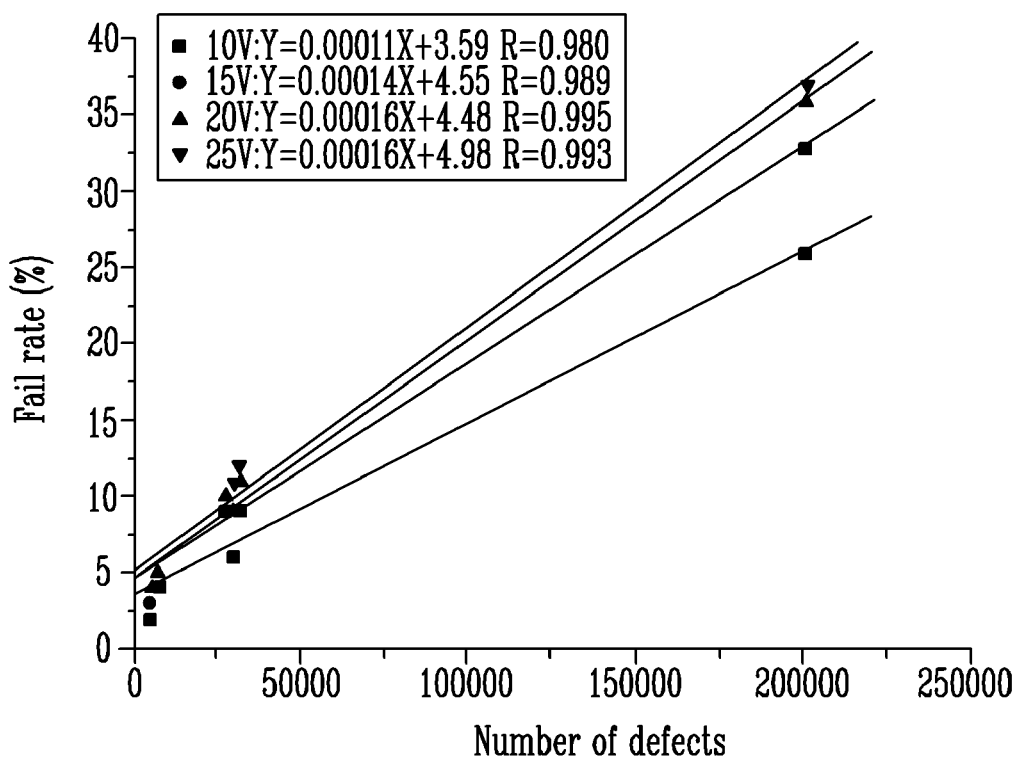
FIG. 3 is a graph showing the number of defects generated in a test pattern according to voltages applied to a second conductive layer and the fail rate of semiconductor devices formed in a die region corresponding to the test pattern.

FIG. 3 is a graph showing the number of defects generated in the test pattern according to voltages applied to the second conductive layer (refer to FIG. 1) and the fail rate of semiconductor devices formed in the die region corresponding to the test pattern. From FIG. 3, it can be seen that the number of defects occurred in the test pattern and the fail rate of the semiconductor devices formed in the die region corresponding to the test pattern have a clear correlation.

According to the method of inspecting defects of a semiconductor device in accordance with the present invention, a defect occurring in an isolation layer can be inspected during a semiconductor manufacturing process by measuring a current flowing between a conductive layer and a semiconductor substrate of a test pattern formed up to the conductive layer corresponding to a control gate of the semiconductor device. Accordingly, the yield of semiconductor devices can be improved with the inspection results.

The embodiment disclosed herein has been proposed to allow a person skilled in the art to easily understand the present invention. Therefore, the scope of the present invention is not limited by or to the embodiment as described above, and should be construed to be defined by the appended claims.

What is claimed is:

1. A method of inspecting defects in a semiconductor device, the method comprising:
   forming a test pattern in a scribe lane region of a semiconductor substrate, the test pattern including a conductive layer for inspecting defects and a dielectric layer formed on an isolation layer of the semiconductor substrate; and
   measuring a current flowing between the conductive layer for inspecting defects and the semiconductor substrate by applying a first voltage between the conductive layer and the semiconductor substrate,
   wherein the formation of the test pattern comprises forming a gate insulating layer and a first conductive layer over the semiconductor substrate, etching the first conductive layer, the gate insulating layer, and the semiconductor substrate, gap-filling the etching result with insulating material to form an isolation layer, and forming a second conductive layer used as the conductive layer for inspecting defects over the first conductive layer including the isolation layer.

2. The method of claim 1, wherein a size of the test pattern is about 1 to 5% of a size of a semiconductor device region formed in a die region of the semiconductor substrate corresponding to the test pattern.

3. The method of claim 1, wherein the first voltage ranges from about 10 to 30V.

4. The method of claim 1, wherein when an amount of the current flowing between the conductive layer for inspecting defects and the semiconductor substrate in the test pattern is 1.0E-6 to 1.0E-2 Ampere, determining that there is a defect in a semiconductor device corresponding to the test pattern.

5. The method of claim 1, wherein the second conductive layer of the test pattern is not patterned, but the second conductive layer of the die region is patterned.

6. The method of claim 1, further comprising forming a capacitor in the gate insulating layer after the second conductive layer is formed.

* * * * *